United States Patent
Minamida et al.

(10) Patent No.: US 10,056,269 B2
(45) Date of Patent: Aug. 21, 2018

(54) SUBSTRATE LIQUID PROCESSING APPARATUS

(71) Applicant: Tokyo Electron Limited, Tokyo (JP)

(72) Inventors: Junya Minamida, Koshi (JP); Shogo Kiyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 143 days.

(21) Appl. No.: 14/924,870

(22) Filed: Oct. 28, 2015

(65) Prior Publication Data

US 2016/0126112 A1    May 5, 2016

(30) Foreign Application Priority Data

Oct. 31, 2014  (JP) ................. 2014-223486

(51) Int. Cl.
    H01L 21/67    (2006.01)
(52) U.S. Cl.
    CPC .... *H01L 21/67017* (2013.01); *H01L 21/6708* (2013.01); *H01L 21/6719* (2013.01); *H01L 21/67051* (2013.01); *H01L 21/67173* (2013.01); *H01L 21/67178* (2013.01)
(58) Field of Classification Search
    CPC ................................ H01L 21/67017
    See application file for complete search history.

(56) References Cited

U.S. PATENT DOCUMENTS

2003/0121173 A1    7/2003    Bae
2011/0203524 A1    8/2011    Uno

FOREIGN PATENT DOCUMENTS

| JP | 02-95516 U | 7/1990 |
|---|---|---|
| JP | 10-177945 A | 6/1998 |
| JP | 2002-170807 A | 6/2002 |
| JP | 2004-088104 A | 3/2004 |
| JP | 2005-042698 A | 2/2005 |
| JP | 2008-034490 A | 2/2008 |
| JP | 2009-117824 A | 5/2009 |
| JP | 2009-252884 A | 10/2009 |
| JP | 2011-204933 A | 10/2011 |
| JP | 2012-142404 A | 7/2012 |
| JP | 2013-033922 A | 2/2013 |
| JP | 2014-197592 A | 10/2014 |
| TW | 200515464 A | 5/2005 |

*Primary Examiner* — Jason Y Ko

(74) *Attorney, Agent, or Firm* — Pearne & Gordon LLP

(57) ABSTRACT

Gas-liquid separation of an exhaust gas from a liquid processing unit can be improved. A substrate liquid processing apparatus includes a liquid processing unit, a first exhaust pipe and a second exhaust pipe. The liquid processing unit is configured to process a substrate with a processing liquid. At least a part of the first exhaust pipe at is located above the liquid processing unit. One end of the second exhaust pipe is connected to the liquid processing unit, and the second exhaust pipe is configured to evacuate the liquid processing unit through the first exhaust pipe by an exhaust device. Further, the other end of the second exhaust pipe is connected to a portion of the first exhaust pipe which is located above the liquid processing unit.

13 Claims, 10 Drawing Sheets

SUBSTRATE LIQUID PROCESSING APPARATUS

CROSS-REFERENCE TO RELATED APPLICATION

This application claims the benefit of Japanese Patent Application No. 2014-223486 filed on Oct. 31, 2014, the entire disclosures of which are incorporated herein by reference.

TECHNICAL FIELD

The embodiments described herein pertain generally to a substrate liquid processing apparatus.

BACKGROUND

Conventionally, there is known a substrate liquid processing apparatus that performs a liquid process on a substrate such as a silicon wafer or a compound semiconductor wafer.

For example, there is known a substrate liquid processing apparatus in which a space for accommodating a gas exhaust pipe through which an exhaust gas from a liquid processing unit is flown is formed under the liquid processing unit (see Patent Document 1).

Patent Document 1: Japanese Patent Laid-open Publication No. 2008-034490

In the above-described prior art, however, there is still a room for improvement in that gas-liquid separation of the exhaust gas from the liquid processing unit can be improved.

For example, in the above-described prior art, a liquid drain cup and a gas exhaust cup are provided in the liquid processing unit, and it is attempted to improve the gas-liquid separation by performing the liquid draining from the liquid drain cup and the gas exhaust from the gas exhaust cup independently. However, there is still a concern that mist, for example, may be introduced into a gas exhaust path. Such introduction of the mist into the gas exhaust path is suppressed by providing a mist trap in the gas exhaust path, for example. However, it is still required to further suppress the introduction of the mist.

SUMMARY

In view of the foregoing, exemplary embodiments provide a substrate liquid processing apparatus capable of improving gas-liquid separation of an exhaust gas from a liquid processing unit.

In one exemplary embodiment, a substrate liquid processing apparatus includes a liquid processing unit, a first exhaust pipe and a second exhaust pipe. The liquid processing unit is configured to process a substrate with a processing liquid. At least a part of the first exhaust pipe is located above the liquid processing unit. One end of the second exhaust pipe is connected to the liquid processing unit, and the second exhaust pipe is configured to evacuate the liquid processing unit through the first exhaust pipe by an exhaust device. Further, the other end of the second exhaust pipe is connected to a portion of the first exhaust pipe which is located above the liquid processing unit.

According to the exemplary embodiment, it is possible to improve the gas-liquid separation of the exhaust gas from the liquid processing unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
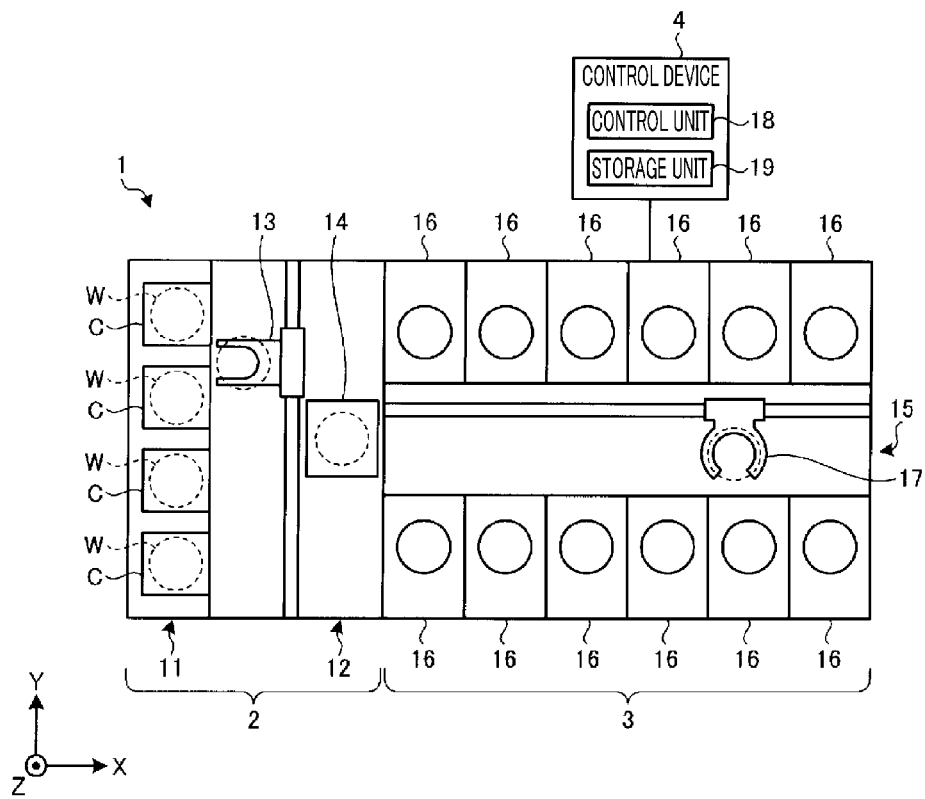
FIG. 1 is a diagram illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate liquid processing apparatus according to exemplary embodiments will be described with reference to the accompanying drawings. The exemplary embodiments are not limiting.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
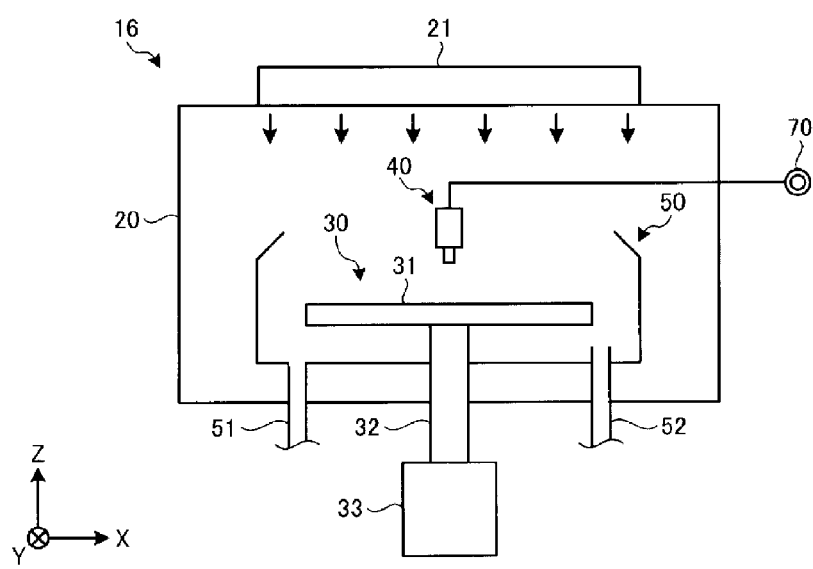
FIG. 2 is a diagram illustrating an outline of a processing unit.

Now, a configuration of the processing unit 16 will be elaborated with reference to FIG. 2. FIG. 2 is a diagram illustrating an outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
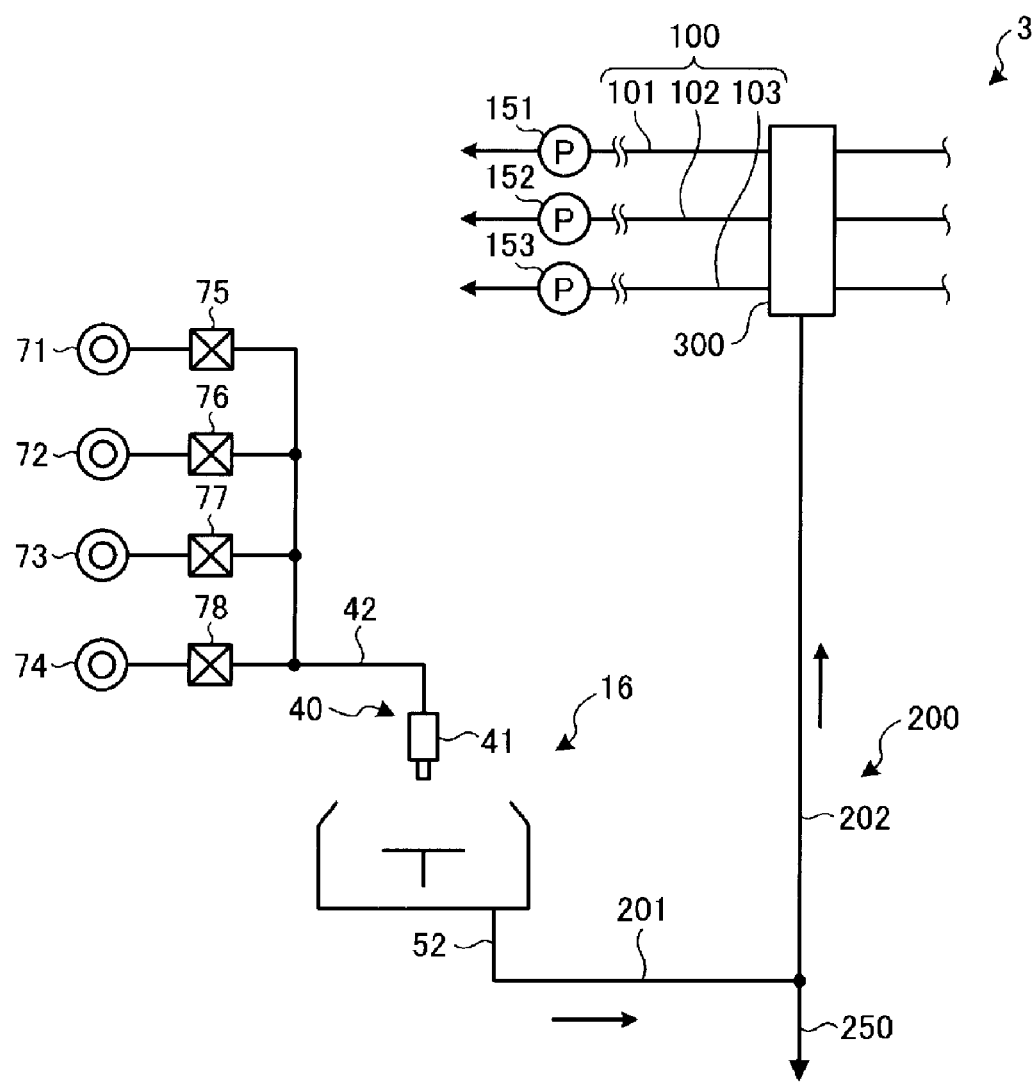
FIG. 3 is a diagram illustrating a gas exhaust path of the processing unit.

Now, a gas exhaust path of the processing unit 16 will be elaborated with reference to FIG. 3. FIG. 3 is a diagram illustrating the gas exhaust path of the processing unit 16. In FIG. 3, components necessary to explain the gas exhaust path of the processing unit 16 are mainly depicted, and illustration of general components is appropriately omitted.

First, a configuration of the processing unit 16 according to the present exemplary embodiment will be discussed. As depicted in FIG. 3, the processing unit 16 includes the processing fluid supply unit 40 (corresponding to an example of "processing liquid supply unit") having a nozzle 41; and a pipeline 42. One end of the pipeline 42 is connected to the nozzle 41. The other end of the pipeline 42 is branched into plural lines, and an alkaline processing liquid supply source 71, an acidic processing liquid supply source 72, an organic processing liquid supply source 73 and a DIW supply source 74 are connected to the ends of the branched lines, respectively. Further, valves 75 to 78 are provided between the supply sources 71 to 74 and the nozzle 41, respectively.

The processing fluid supply unit 40 is configured to supply an alkaline processing liquid, an acidic processing liquid, an organic processing liquid and DIW (pure water of a room temperature) respectively fed from the corresponding supply sources 71 to 74 onto a surface (processing target surface) of the wafer W through the nozzle 41.

In the present exemplary embodiment, SC1 (a mixed solution of ammonia, hydrogen peroxide and water), HF (hydrofluoric acid) and IPA (isopropyl alcohol) are used as the alkaline processing liquid, the acidic processing liquid and the organic processing liquid, respectively. However, it should be noted that the acidic processing liquid, the alkaline processing liquid and the organic processing liquid are not limited to these examples.

Furthermore, in the present exemplary embodiment, the alkaline processing liquid, the acidic processing liquid, the organic processing liquid and the DIW are supplied from the single nozzle 41. However, the processing fluid supply unit 40 may be equipped with a plurality of nozzles corresponding to the respective processing liquids.

Here, desirably, an alkaline exhaust gas discharged from the processing unit 16 when using the SC1, an acidic exhaust gas discharged from the processing unit 16 when using the HF and an organic exhaust gas discharged from the processing unit 16 when using the IPA need to be discharged individually in consideration of safety issues, etc., or suppression of exhaust pipe contamination. For this reason, in the substrate processing system 1 according to the present exemplary embodiment, there are provided separate gas exhaust paths for the alkaline exhaust gas, the acidic exhaust gas and the organic exhaust gas, respectively.

Now, a configuration of the gas exhaust path of the processing unit 16 will be explained. As the gas exhaust path of the processing unit 16, the processing station 3 of the substrate processing system 1 is equipped with a first exhaust pipe 101, a second exhaust pipe 200 and an exhaust switching unit 300.

The first exhaust pipe 100 includes a plurality of individual exhaust pipes 101 to 103. The individual exhaust pipe 101 is a pipeline through which the alkaline exhaust gas flows; the individual exhaust pipe 102, a pipeline through which the acidic exhaust gas flows; and the individual exhaust pipe 103, a pipeline through which the organic exhaust gas flows. These individual exhaust pipes 101 to 103 are equipped with exhaust devices 151 to 153, respectively. Each of the exhaust devices 151 to 153 may be implemented by a suction apparatus such as a pump.

In the present exemplary embodiment, at least a part of the individual exhaust pipes 101 to 103 is positioned above the processing unit 16. A specific layout of the individual exhaust pipes 101 to 103 will be described later.

The second exhaust pipe 200 is configured to guide an exhaust gas from the processing unit 16 into the first exhaust pipe 100. One end of the second exhaust pipe 200 is connected to the exhaust port 52 of the processing unit 16, and the other end of the second exhaust pipe 200 is connected, via the exhaust switching unit 300 to be described later, to a portion of the first exhaust pipe 100 positioned above the processing unit 16.

The second exhaust pipe 200 includes a horizontal portion 201 horizontally extended from the exhaust port 52 of the processing unit 16; and an upright portion 202 provided at a downstream side of the horizontal portion 201 and vertically extended upwards. Further, a drain unit 250 for draining a liquid within the second exhaust pipe 200 to the outside is provided at the bottommost position of the upright portion 202.

The exhaust switching unit 300 is connected to the upright portion 202 of the second exhaust pipe 200, and configured to switch a discharge destination of the exhaust gas from the processing unit 16 to one of the individual exhaust pipes 101 to 103. Like the first exhaust pipe 100, the exhaust switching unit 300 is also provided at a position above the processing unit 16.

The gas exhaust path of the processing unit 16 is configured as described above, and the exhaust gas from the processing unit 16 is discharged into one of the individual exhaust pipes 101 to 103 through the second exhaust pipe 200 and the exhaust switching unit 300.

Here, in the substrate processing system 1 according to the present exemplary embodiment, at least a part of the first exhaust pipe 100 and the exhaust switching unit 300 are positioned above the processing unit 16, and the other end of the second exhaust pipe 200 is connected to the portion of the first exhaust pipe 100 positioned above the processing unit 16 via the exhaust switching unit 300. Accordingly, the exhaust gas from the processing unit 16 is discharged into the first exhaust pipe 100 through the exhaust switching unit 300 after flowing upwards in the upright portion 202 of the second exhaust pipe 200.

The exhaust gas from the processing unit 16 may contain mist. Since the mist is heavier than a gas, it is difficult for the mist to flow upwards within the upright portion 202, as compared to the exhaust gas. Accordingly, while the exhaust gas containing the mist flows in the upright portion 202, the exhaust gas which tends to easily flow upwards in the upright portion 202 and the mist which cannot easily flow upwards in the upright portion 202 are efficiently separated from each other. Then, the exhaust gas is discharged to the outside from the first exhaust pipe 100 via the exhaust switching unit 300 provided above the upright portion 202, whereas the mist is liquefied by a temperature reduction and, then, discharged to the outside through the drain unit 250 provided at the bottommost position of the upright portion 202.

As stated above, in the substrate processing system 1 according to the present exemplary embodiment, the gas exhaust path of the processing unit 16 includes the upright portion 202, and the exhaust gas from the processing unit 16 is guided upwardly. Accordingly, it is possible to improve the gas-liquid separation of the exhaust gas discharged from the processing unit 16. Furthermore, since the gas-liquid separation is performed within the upright portion 202, contaminants or impurities generated from the mist can be suppressed from adhering to the exhaust switching unit 300 provided at the downstream side of (provided above) the upright portion 202.

Moreover, once the mist is liquefied, the liquid falls down within the upright portion 202 to be collected at the bottommost position of the upright portion 202. Thus, by providing the drain unit 250 at the bottommost position of the upright portion 202, the liquid within the second exhaust pipe 200 can be discharged to the outside efficiently.

Here, the bottommost position of the upright portion 202 in the present exemplary embodiment corresponds to a corner portion between the horizontal portion 201 and the upright portion 202. When the mist flowing in the second exhaust pipe 200 moves from the horizontal portion 201 to the upright portion 202, the mist may collide with the corner portion to be liquefied. As such, by providing the corner portion between the horizontal portion 201 and the upright portion 202 and providing the drain unit 250 at the corner portion, the liquid within the second exhaust pipe 200 can be more efficiently collected.

In addition, the substrate processing system 1 may be further equipped with a cooling water discharging unit configured to discharge cooling water into the upright portion 202 from above it. With this configuration, it is possible to liquefy the mist within the upright portion 202 more actively by cooling it with the cooling water.

Since the alkaline exhaust gas, the acidic exhaust gas and the organic exhaust gas all flow within the second exhaust pipe 200, there is a likelihood that the inside of the second exhaust pipe may be contaminated with, for example, salt generated therein. As a solution to this problem, the substrate processing system 1 may be equipped with a cleaning water discharging unit configured to discharge cleaning water into the second exhaust pipe 200. With this configuration, the contaminant within the second exhaust pipe 200 can be removed by the cleaning water.

In the present exemplary embodiment, the drain unit 250 is provided at the bottommost position of the upright portion 202 (i.e., at the corner portion between the horizontal portion 201 and the upright portion 202). Alternatively, however, the drain unit 250 may be provided at the horizontal portion 201. Furthermore, though the second exhaust pipe 200 is described to have the horizontal portion 201, the second exhaust pipe 200 may not necessarily have the horizontal portion 201.

In addition, the present exemplary embodiment has been described for the example case where the upright portion 202 is vertically extended. However, the upright portion 202 may be extended diagonally, spirally, in a zigzag shape, or the like. By forming the upright portion 202 to have these shapes, the length of the upright portion 202 can be increased, as compared to the case where it is extended vertically. As the length of the upright portion 202 increases, a greater amount of mist may be liquefied in the upright portion 202 by a temperature reduction, and, thus, the gas-liquid separation can be further improved.

Figure 4:
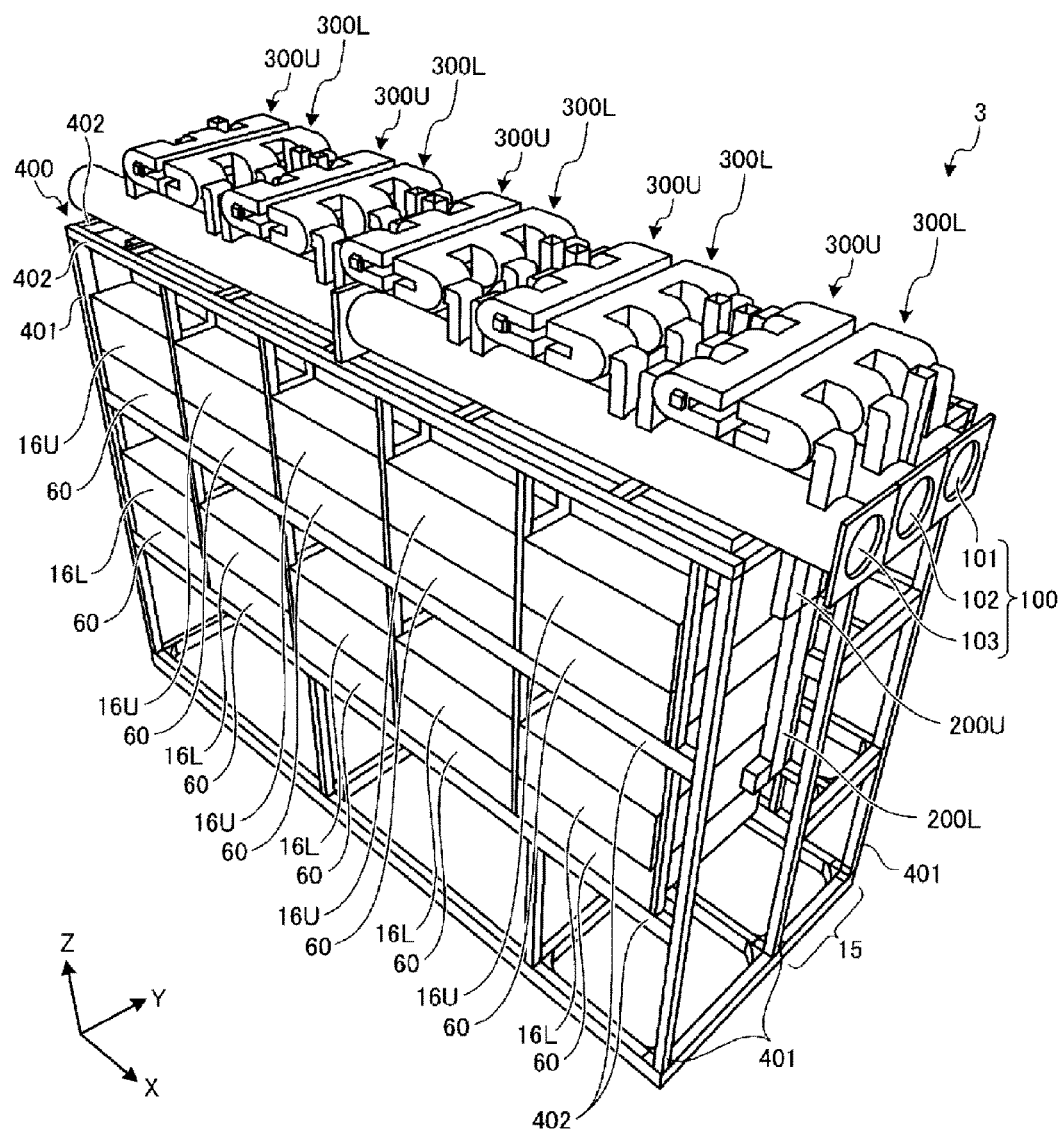
FIG. 4 is a schematic perspective view illustrating a processing station.
Figure 5:
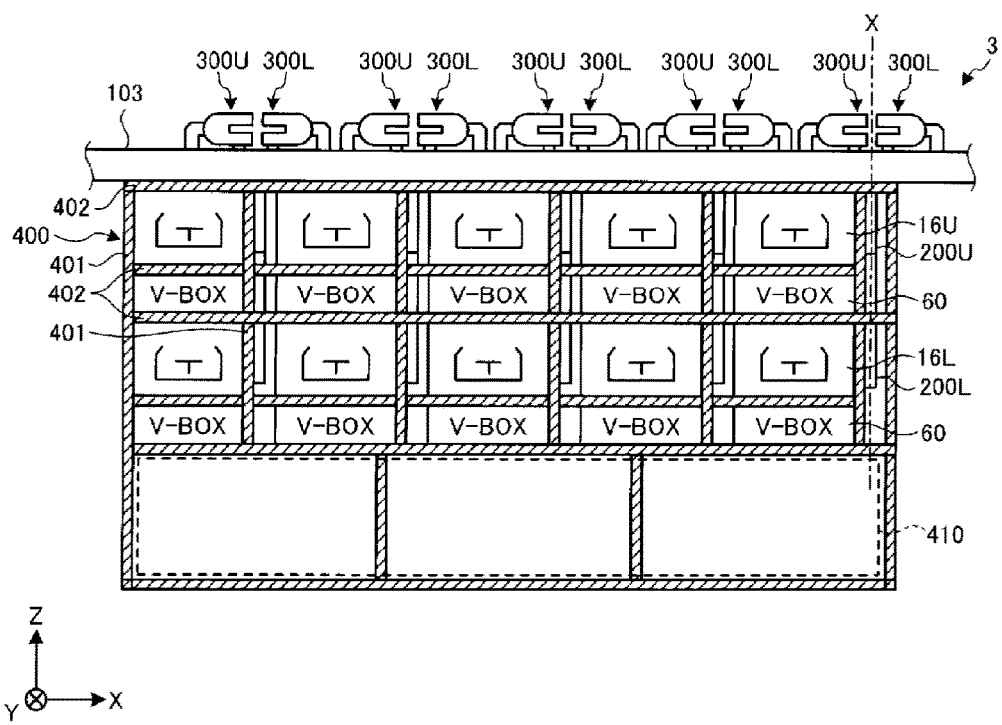
FIG. 5 is a schematic side view illustrating the processing station.
Figure 6:
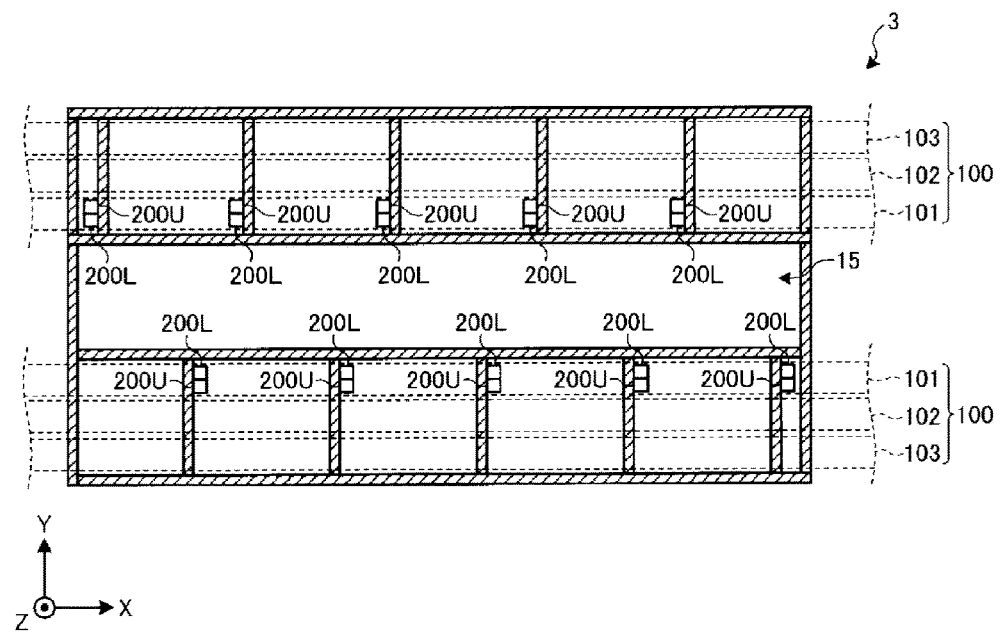
FIG. 6 is a schematic plan view illustrating the processing station.

Now, the layout of the first exhaust pipe 100, the second exhaust pipe 200 and the exhaust switching unit 300 described above will be elaborated with reference to FIG. 4 to FIG. 7. FIG. 4 is a schematic perspective view of the processing station 3. Further, FIG. 5 is a schematic side view of the processing station 3, and FIG. 6 is a schematic plan view thereof. Here, the side view is a diagram illustrating the processing station 3 seen from a positive Y-axis direction, and the plan view is a diagram illustrating the processing station 3 seen from a negative Z-axis direction. Further, in FIG. 4, illustration of a configuration of the processing station 3 which is located at the side of the positive Y-axis direction with respect to the transfer section 15 (see FIG. 1) is omitted.

As depicted in FIG. 4 and FIG. 5, the processing station 3 includes a frame structure 400 having a multiple number of column portions 401 and a multiplicity of beam portions 402. A plurality of processing units 16 and a plurality of valve boxes 60 are accommodated in spaces formed by the column portions 401 and the beam portions 402.

The plurality of processing units 16 are arranged in parallel along the transfer section 15 and vertically stacked in two levels. Each of the plurality of valve boxes 60 is a container in which the valves 75 to 78 (see FIG. 3) and the like are accommodated, and is provided under each processing unit 16.

In the following, among the processing units 16 vertically stacked in two levels, each processing unit 16 provided at the upper level will be referred to as "processing unit 16U", and each processing unit 16 provided at the lower level will be referred to as "processing unit 16L." Further, though the processing units 16 are vertically stacked in two levels in the present exemplary embodiment, the stacking number of the processing units 16, i.e., the number of the vertical levels of the processing units 16 may not be limited to two. Moreover, FIG. 4 to FIG. 6 illustrate an example layout where five processing units 16 are arranged in parallel, the number of the processing units 16 arranged in parallel may not be limited to five.

The individual exhaust pipes 101 to 103 of the first exhaust pipe 100 are placed on the frame structure 400, and the exhaust switching units 300 respectively corresponding to the processing units 16 are placed on the individual exhaust pipes 101 to 103.

As stated, in the substrate processing system 1 according to the exemplary embodiment, the individual exhaust pipes 101 to 103 and the exhaust switching units 300 are placed at the outside of the frame structure 400. Accordingly, the assembly of the frame structure 400, the assembly of the individual exhaust pipes 101 to 103, and the assembly of the exhaust switching units 300 can be delivered individually. Therefore, the transfer or the installation of these components can be eased.

Moreover, in the substrate processing system 1 according to the exemplary embodiment, since the first exhaust pipe 100 and the exhaust switching units 300 are disposed at the outside of the frame structure 400, the configuration of the first exhaust pipe 100 and the exhaust switching units 300 can be easily modified depending on the substrate processing kinds.

By way of example, when using only two kinds of processing liquids (the alkaline processing liquid and the acidic processing liquid), a first exhaust pipe 100 without having the individual exhaust pipe 103 and exhaust switching units 300 corresponding to this first exhaust pipe 100 may be easily provided on the frame structure 400. As described, according to the substrate processing system 1 of the exemplary embodiment, the degree of freedom in design can be improved.

Furthermore, in the substrate processing system 1 according to the present exemplary embodiment, it is easier to provide an extra space 410 (see FIG. 5) within the frame structure 400, as compared to the case where the first exhaust pipe 100 and the exhaust switching units 300 are accommodated within the frame structure 400. The extra space 410 may be provided at the bottommost portion of the frame structure 400, and may be used as a space for accommodating various supply sources such as the alkaline processing liquid supply source 71 and the acidic processing liquid supply sources 72.

Further, the exhaust switching units 300 according to the exemplary embodiment are placed on the individual exhaust pipes 101 to 103. That is, the exhaust switching units 300 are located at the topmost portion of the processing station 3. With this configuration, an operator can easily perform replacement or maintenance of the exhaust switching units 300. Here, the exhaust switching units 300 needs to be located at least above the processing units 16. For example, the exhaust switching units 300 may be disposed under the individual exhaust pipes 101 to 103.

As depicted in FIG. 4 and FIG. 5, the first exhaust pipe 100 is placed above the processing units 16U arranged at the topmost level, and second exhaust pipes 200 U and 200L corresponding to the upper processing units 16U and the lower processing units 16B, respectively, are connected to the first exhaust pipe 100 via corresponding exhaust switching units 300U and 300L, respectively.

As stated above, in the substrate processing system 1 according to the exemplary embodiment, the upper processing units 16U and the lower processing units 16L share the first exhaust pipe 100. Thus, as compared to the case where individual first exhaust pipes 100 are provided for the respective upper processing units 16U and lower processing units 16L, a manufacturing cost of the substrate processing system 1 can be reduced.

In addition, as depicted in FIG. 6, the substrate processing system 1 includes a first exhaust pipe 100 corresponding to processing units 16 located at the side of the negative Y-axis direction with respect to the transfer section 15; and a first exhaust pipe 100 corresponding to processing units 16 located at the side of the positive Y-axis direction with respect to the transfer section 15. Each first exhaust pipe 100 is placed above a region where the corresponding processing units 16 are disposed.

Here, among the multiple second exhaust pipes 200, the second exhaust pipes 200U connected to the upper processing units 16U and the second exhaust pipes 200L connected to the lower processing units 16L are arranged at the same side of these processing units 16U and 16L. By way of example, FIG. 5 illustrates an example configuration where the second exhaust pipes 200U and 200L are disposed at the right side of the processing units 16U and 16L when the processing station 3 is seen from the positive Y-axis direction.

Moreover, among the plurality of exhaust switching units 300, the exhaust switching units 300U corresponding to the upper processing units 16U and the exhaust switching units 300L corresponding to the lower processing units 16L are alternately arranged in an arrangement direction of the processing units 16.

Each exhaust processing unit 300U and each exhaust processing unit 300L have the same configuration, and are arranged to face each other. To elaborate, as depicted in FIG. 5, when the processing station 3 is seen from the positive Y-axis direction, the exhaust switching unit 300U corresponding to the upper processing unit 16U and the exhaust switching unit 300L corresponding to the lower processing unit 16L are arranged in line symmetry with respect to the second exhaust pipes 200U and 200L, as a central line X, which are connected to the processing units 16U and 16L, respectively.

As stated above, in the substrate processing system 1, the second exhaust pipe 200U connected to the upper processing unit 16U and the second exhaust pipe 200L connected to the lower processing unit 16 are arranged at the same side of the processing units 16U and 16L. Furthermore, the exhaust switching unit 300U corresponding to the upper processing unit 16U and the exhaust switching unit 300L corresponding to the lower processing unit 16L are arranged to face each other in line symmetry with respect to the second exhaust pipes 200U and 200L as the central line X. With this layout, the second exhaust pipes 200U and 200L or the exhaust switching units 300U and 300L can be commonly shared at the upper level and the lower level.

Moreover, the exhaust switching unit 300U and the exhaust switching unit 300L may not necessarily be disposed to face each other. By way of example, the exhaust switching unit 300U and the exhaust switching unit 300L may be arranged to face the same direction. In such a case, for example, the second exhaust pipe 200L connected to the lower processing unit 16L may be vertically extended and coupled to the exhaust switching unit 300L, whereas the second exhaust pipe 200U connected to the upper processing unit 16U may be diagonally extended and coupled to the exhaust switching unit 300U.

Figure 7:
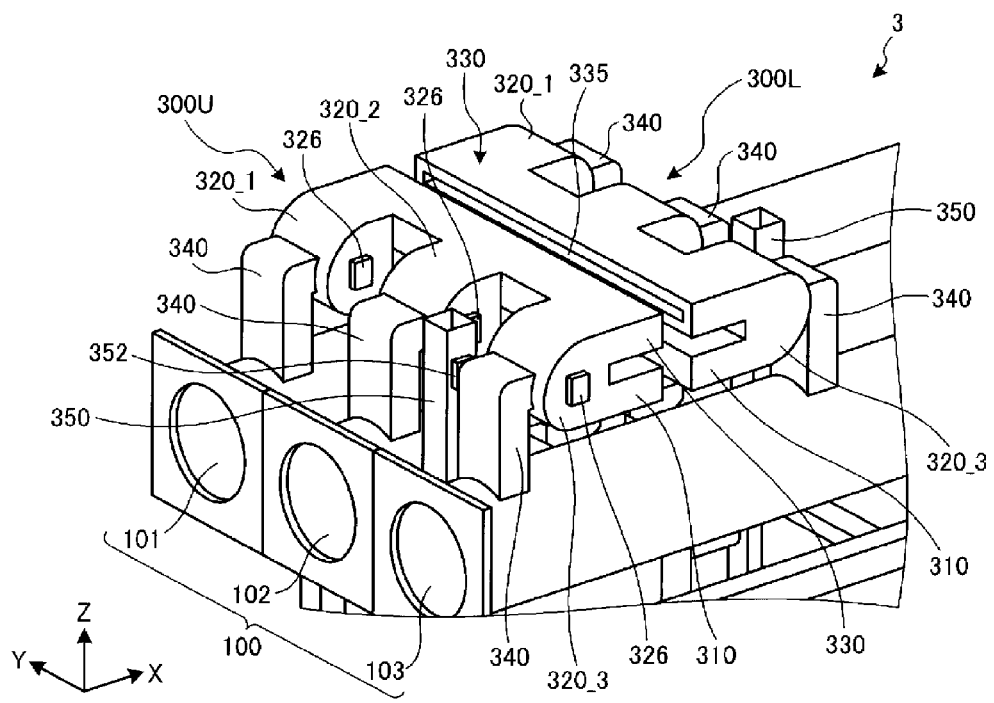
FIG. 7 is a schematic perspective view illustrating an exhaust switching unit.
Figure 8:
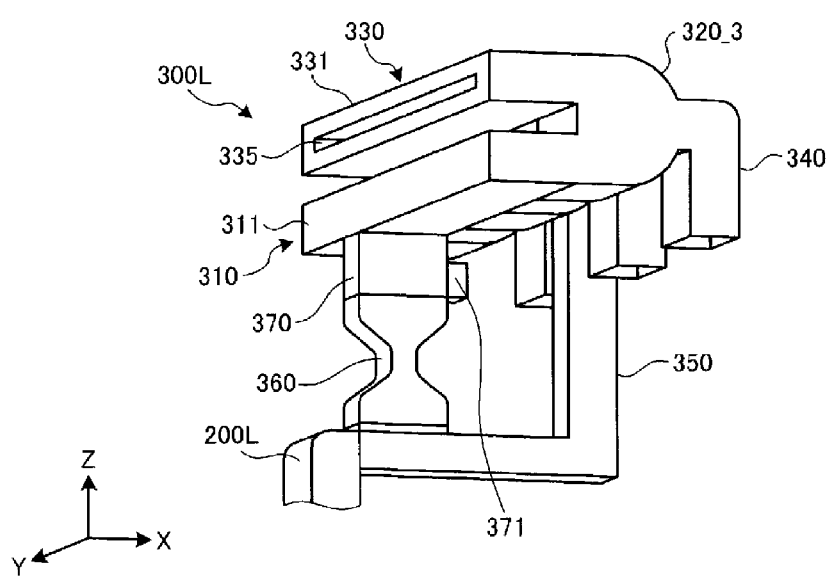
FIG. 8 is a schematic perspective view illustrating the gas exhaust switching unit.

Now, a configuration of the exhaust switching unit 300 will be explained with reference to FIG. 7 and FIG. 8. FIG. 7 and FIG. 8 are schematic perspective views of the exhaust switching unit 300.

As depicted in FIG. 7 and FIG. 8, each of the exhaust switching units 300U and 300L includes an exhaust gas inlet chamber 310, a plurality of switching mechanisms 320_1 to 320_3, an exterior air inlet chamber 330, and a plurality of outlet portions 340. Further, each of the exhaust switching units 300U and 300L further includes an exterior air suction pipe 350, a differential pressure port 360, and an exhaust gas flow rate controller 370.

The exterior air suction pipe 350 of the exhaust switching unit 300L (300U) is connected to the second exhaust pipe 200L (200U) (see FIG. 8), and the outlet portions 340 of the exhaust switching unit 300L (300U) are connected to the individual exhaust pipes 101 to 103, respectively (see FIG. 7). An exhaust gas from the second exhaust pipe 200L (200U) is introduced into one of the switching mechanisms 320_1 to 320_3 through the differential pressure port 360, the exhaust gas flow rate controller 370 and the exhaust gas inlet chamber 310 (see FIG. 8), and then discharged into one of the individual exhaust pipes 101 to 103 through the outlet portion 340 from the corresponding one of the switching mechanisms 320_1 to 320_3.

Further, in each of the exhaust switching unit 300U and 300L, the exhaust gas inlet chamber 310, the switching mechanisms 320_1 to 320_3, the exterior air inlet chamber 330, the outlet portions 340, the exterior air suction pipe 350, the differential pressure port 360 and the exhaust gas flow rate controller 370 are unitized. Accordingly, the exhaust switching unit 300U and 300L can be easily attached to or detached from the individual exhaust pipes 101 to 103 or the second exhaust pipe 200.

The exhaust gas inlet chamber 310 includes a hollow box-shaped main body 311, and a multiple number of communication openings (not shown) communicating with respective exhaust gas suction openings 322 of the switching mechanisms 320_1 to 320_3 are formed at a side surface of the main body 311 which faces the switching mechanisms 320_1 to 320_3. Further, a communication opening (not shown) communicating with the exhaust gas flow rate controller 370 is formed at a bottom surface of the main body 311. The exhaust gas inlet chamber 310 having this configuration is configured to introduce the exhaust gas, which is flown from the second exhaust pipe 200 via the exterior air suction pipe 350, the differential pressure port 360 and the exhaust gas flow rate controller 370 to be described later, into the switching mechanisms 320_1 to 320_3.

Here, the exhaust gas introduced into the exhaust gas inlet chamber 310 from the exhaust gas flow rate controller 370 is flown into one of the switching mechanisms 320_1 to 320_3 after colliding with a top surface of the exhaust gas inlet chamber 310. Therefore, even if the mist is contained in the exhaust gas introduced into the exhaust gas inlet chamber 310, the mist can be liquefied by the collision with the top surface of the exhaust gas inlet chamber 310, so that the mist can be suppressed from reaching the switching mechanisms 320_1 to 320_3.

Furthermore, in the present exemplary embodiment, the exhaust gas inlet chamber 310 is implemented by a box body having a rectangular shape. However, the shape of the exhaust gas inlet chamber 310 may not be limited to the rectangle. By way of non-limiting example, the exhaust gas inlet chamber 310 may be implemented by a box body having a cylindrical shape. By forming the exhaust gas inlet chamber 310 to have the cylindrical shape, it is possible to share members or lines formed of pipes, for example. In this case as well where the exhaust gas inlet chamber 310 has the cylindrical shape, the exhaust gas introduced into the exhaust gas inlet chamber 310 is flown into one of the switching mechanisms 320_1 to 320_3 after colliding with an inner surface of the exhaust gas inlet chamber 310. Therefore, as in the case where the exhaust gas inlet chamber 310 has the rectangular shape, the mist can be liquefied by colliding with the inner surface of the exhaust gas inlet chamber 310.

In the present exemplary embodiment, the exhaust gas inlet chamber 310 is formed of the box body. However, the exhaust gas inlet chamber 310 may not necessarily be formed of the box body. By way of non-limiting example, the exhaust gas inlet chamber 310 may be implemented by a pipeline one end of which is connected to the exhaust gas flow rate controller 370 and the other end of which is branched into plural branch lines respectively connected to the switching mechanisms 320_1 to 320_3.

The switching mechanisms 320_1 to 320_3 correspond to the individual exhaust pipes 101 to 103, respectively, and the switching mechanisms 320_1 to 320_3 are arranged in the same direction (Y direction) as the arrangement direction of the individual exhaust pipes 101 to 103. The exhaust gas inlet chamber 310, the exterior air inlet chamber 330 and the outlet portion 340 are connected to each of the switching mechanisms 320_1 to 320_3. The exhaust gas inlet chamber 310 and the exterior air inlet chamber 330 are connected to one side surface of each of the switching mechanisms 320_1 to 320_3 with a preset vertical interval therebetween. Further, each of the outlet portions 340 is connected to a side surface of the corresponding one of the switching mechanisms 320_1 to 320_ opposite from the side surface thereof to which the exhaust gas inlet chamber 310 and the exterior air inlet chamber 330 are connected.

Figure 9:
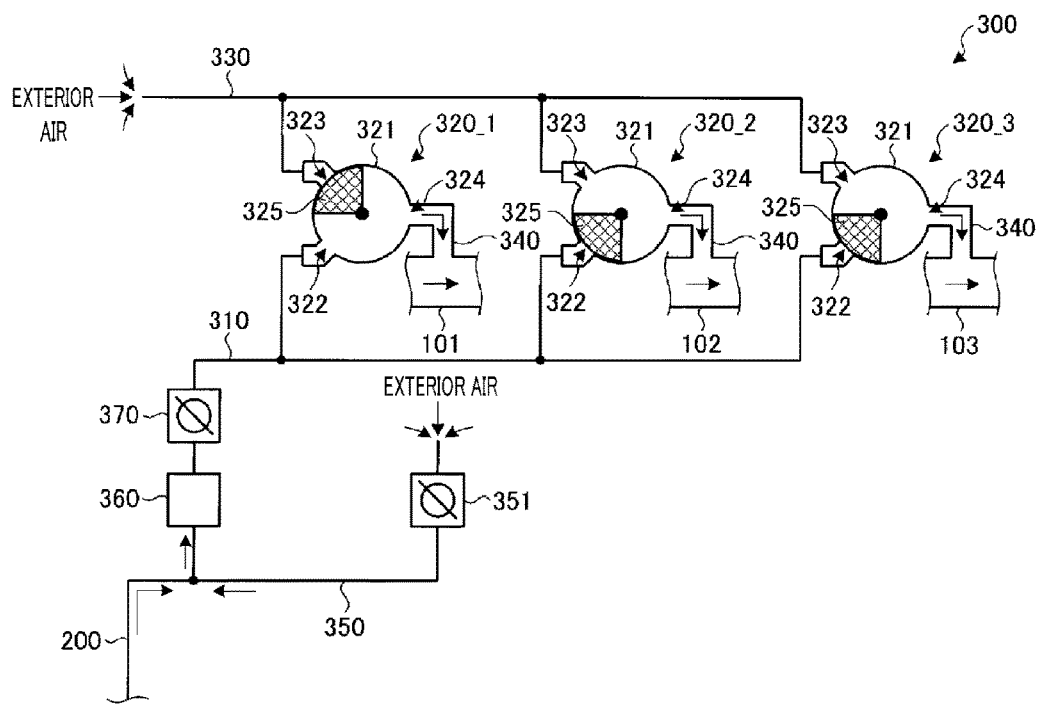
FIG. 9 is a diagram showing a configuration of the gas exhaust switching unit.

Each of the switching mechanisms 320_1 to 320_3 is configured to switch, by operating a valve body provided therein, a state where the exhaust gas inlet chamber 310 communicates with the outlet portion 340 and a state where the exterior air inlet chamber 330 communicates with the outlet portion 340. Here, internal configuration of the switching mechanisms 320_1 to 320_3 will be discussed with reference to FIG. 9. FIG. 9 illustrates a configuration of the exhaust switching unit 300.

As depicted in FIG. 9, each of the switching mechanisms 320_1 to 320_3 includes a main body 321. The main body 321 has a cylindrical internal space both ends of which are closed. An exhaust gas suction opening 322 communicating with the exhaust gas inlet chamber 310, an exterior air suction opening 323 communicating with the exterior air inlet chamber 330 and an outlet opening 324 communicating with the outlet portion 340 are formed at an inner peripheral surface of the main body 321.

A valve body 325 configured to be slidably moved along the inner peripheral surface of the main body 321 is provided in the internal space of the main body 321. The valve body 325 is driven by a driving unit 326 (see FIG. 7) provided outside the switching mechanisms 320_1 to 320_3. The driving unit 326 is controlled by the control unit 18.

Among the exhaust gas suction opening 322, the exterior air suction opening 323 and the outlet opening 324 formed at the inner peripheral surface of the main body 321, either one of the exhaust gas suction opening 322 or the exterior air suction opening 323 is blocked by the valve body 325. That is, only one of the exhaust gas inlet suction opening 322 and the exterior air suction opening 323 is allowed to communicate with the outlet opening 324. In each of the switching mechanisms 320_1 to 320_3, as the valve body 325 is slid along the inner peripheral surface of the main body 321, the opening communicating with the outlet opening 324 is switched from the exhaust gas suction opening 322 to the exterior air suction opening 323, or from the exterior air suction opening 323 to the exhaust gas suction opening 322. That is, each of the switching mechanisms 320_1 to 320_3 is configured to perform a switchover between a state where the exhaust gas inlet chamber 310 communicates with the outlet opening 340 and a state where the exterior air inlet chamber 330 communicates with the outlet opening 340.

Figure 10:
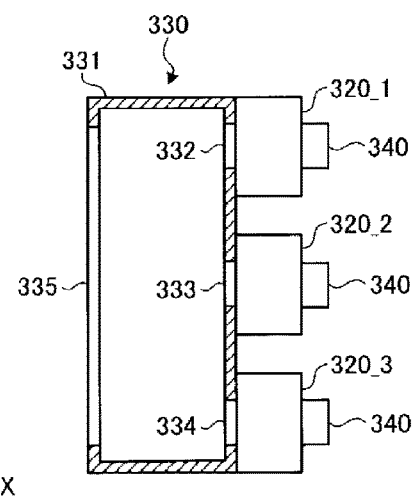
FIG. 10 is a diagram showing a configuration of an exterior air inlet chamber.

The exterior air inlet chamber 330 is connected to the switching mechanisms 320_1 to 320_3, and configured to suck the exterior air and supply it into the switching mechanisms 320_1 to 320_3. Here, a configuration of the exterior air inlet chamber 330 will be described with reference to FIG. 10. FIG. 10 is a diagram illustrating a configuration of the exterior air inlet chamber 330. FIG. 10 schematically depicts horizontal cross section of the exterior air inlet chamber 330.

As depicted in FIG. 10, the exterior air inlet chamber 330 includes a main body 331. The main body 331 is a hollow box body, and a multiple number of communication openings 332 to 334 communicating with the respective the exterior air suction openings 323 of the switching mechanisms 320_1 to 320_3 are formed at a side surface of the main body 331 which faces the switching mechanisms 320_1 to 320_3. Further, a slit-shaped opening 335 opened along the arrangement direction of the communication openings 332 to 334 is formed at a side surface of the main body 331 opposite from the side surface where the communication openings 332 to 334 are provided.

The exterior air is introduced into the main body 331 through the opening 335 and then is introduced into one of the switching mechanisms 320_1 to 320_3 through the corresponding one of the communication openings 332 to 334 after passing through the main body 331.

Here, the opening 335 is formed along the arrangement direction of the communication openings 332 to 334. Accordingly, a pressure loss within the main body 331 may occur in as uniform a manner as possible, which will be described later again. Furthermore, though the opening 335 is formed to have a slit shape in the present exemplary embodiment, the shape of the opening 335 is not limited to the slit shape. For example, the opening 335 may be composed of a multiple number of small holes formed along the arrangement direction of the communication openings 332 to 334.

Moreover, the exterior air inlet chamber 330 may have an opening adjuster configured to adjust the opening degree of the opening 335. The opening adjuster may be a shutter which is fixed to the side surface of the main body 331 where the opening 335 is formed, and configured to open/close the opening 335. As described, by providing the opening adjuster, the pressure loss that occurs within the main body 331 can be controlled.

Here, the opening 335 is described to be formed at the surface of the main body 331 opposite from the surface where the communication openings 332 to 332 are formed. However, the location of the opening 335 may not be limited thereto as long as the opening 335 is provided at a surface different from the surface where the communication openings 332 to 334 is formed. By way of example, if the communication openings 332 to 334 are formed at a side surface of the main body 331, the opening 335 may be formed at a top surface of the main body 331.

The exterior air suction pipe 350 is a pipeline one end of which is connected to the second exhaust pipe 200 and the other end of which is opened to the atmosphere (see FIG. 7 to FIG. 9). An exterior air flow rate controller 351 is provided at a portion of the exterior air suction pipe 350. The exterior air flow rate controller 351 is, for example, a damper, and by varying the opening degree of the damper through a driving unit 352 (see FIG. 7), a flow rate of the exterior air flowing to the one end of the exterior air suction pipe 350 is adjusted. The driving unit 352 is controlled by the control unit 18. The exterior air suction pipe 350 and the exterior air flow rate controller 351 are used when changing an amount of air supply into the processing unit 16.

Further, in the present exemplary embodiment, the one end of the exterior air suction pipe 350 is connected to the second exhaust pipe 200. However, the connection position of the one end of the exterior air suction pipe 350 may not be limited thereto and only needs to be located at an upstream side of the switching mechanisms 320_1 to 320_3. By way of non-limiting example, the one end of the exterior air suction pipe 350 may be connected to the exhaust gas inlet chamber 310.

An upstream-side end portion of the differential pressure port 360 is connected to the one end of the exterior air suction pipe 350, and a downstream-side end portion of the differential pressure port 360 is connected to the exhaust gas flow rate controller 370. The differential pressure port 360 is configured to detect a pressure difference between the upstream side and the downstream side and output a detection result to the control unit 18. The control unit 18 controls the exhaust gas flow rate controller 370 based on the detection result from the differential pressure port 360, so that the flow rate of the exhaust gas flown into to the exhaust gas inlet chamber 310 can be maintained at a preset value. Furthermore, the differential pressure port 360 may have a throttle at a portion thereof and may be configured to detect a pressure difference between the upstream side and the downstream side of the throttle.

An upstream-side end portion of the exhaust gas flow rate controller 370 is connected to the differential pressure port 360, and a downstream-side end portion of the exhaust gas flow rate controller 370 is connected to the exhaust gas inlet chamber 310. The exhaust gas flow rate controller 370 accommodates therein, for example, a damper. The exhaust gas flow rate controller 370 is capable of adjusting the flow rate of the exhaust gas flown into the exhaust gas inlet chamber 310 from the differential pressure port 360 by changing the opening degree of the damper by using a driving unit 371 (see FIG. 8). Further, the driving unit 371 is controlled by the control unit 18.

Here, as stated above, in the substrate processing system 1 according to the present exemplary embodiment, the gas exhaust pipe 100 placed on the frame structure 400 is commonly shared by the upper processing unit 16U and the lower processing unit 16L. In this configuration, the length of the second exhaust pipe 200L connected to the processing unit 16L is longer than the length of the second exhaust pipe 200U connected to the processing unit 16U. Accordingly, there may be generated a difference in flow resistances of the gas exhaust paths, so that gas exhaust amounts from the processing unit 16U and the processing unit 16L may become non-uniform.

Meanwhile, the exhaust switching unit 300 according to the exemplary embodiment is equipped with the differential pressure port 360 and the exhaust gas flow rate controller 370. The control unit 18 controls upper and lower exhaust gas flow rate controllers 370 based on the detection results from upper and lower differential pressure ports 360, respectively, so that the gas exhaust amount at the upper side and the gas exhaust amount at the lower side can be made uniform.

Now, an operation of switching the discharge destination of the exhaust gas from the processing unit 16 between the individual exhaust pipes 101 to 103 will be explained.

By way of example, FIG. 9 illustrates an example where the alkaline exhaust gas is flown into the individual exhaust pipe 101. In this case, within the exhaust switching unit 300, the exhaust gas suction opening 322 of the switching mechanism 320_1 communicates with the exhaust gas inlet chamber 310, and the exterior air suction openings 323 of the other switching mechanisms 320_2 and 320_3 communicate with the exterior air inlet chamber 330.

That is, while the switching mechanism 320_1 communicates with the exhaust gas inlet chamber 310, the other switching mechanisms 320_2 and 320_3 communicate with the exterior air inlet chamber 330. Accordingly, the alkaline exhaust gas is introduced into the individual exhaust pipe 101, and exterior air is introduced into the other individual exhaust pipes 102 and 103.

Now, a switchover of the discharge destination of the exhaust gas from the individual exhaust pipe 101 to the individual exhaust pipe 102 is assumed. In this case, the control unit 18 controls the driving units 326 of the switching mechanisms 320_1 and 320_2 to allow the exhaust gas suction opening 322 of the switching mechanism 320_2 to communicate with the exhaust gas inlet chamber 310 while allowing the exterior air suction openings 323 of the other switching mechanisms 320_1 and 320_3 to communicate with the exterior air inlet chamber 330. Accordingly, the acidic exhaust gas is introduced into the individual exhaust pipe 102, whereas the exterior air is flown into the other individual exhaust pipes 101 and 103.

As stated above, in the substrate processing system 1 according to the exemplary embodiment, while the exhaust gas from the processing unit 16 is introduced into one of the individual exhaust pipes 101 to 103, the exterior air is introduced into the others of the individual exhaust pipes 101 to 103. Accordingly, a flow rate of a gas introduced into each of the individual gas exhaust pipes 101 to 103 hardly changes before and after the gas exhaust switching operation is performed. Thus, a pressure variation of the processing unit 16 that might be accompanied by the change in the flow rate of the gas can be suppressed.

Moreover, in the substrate processing system 1 according to the exemplary embodiment, by providing, at the front ends of the exterior air suction openings 323 of the switching mechanisms 320_1 to 320_3, the exterior air inlet chamber 330 communicating with the respective exterior air suction openings 323, the pressure variation of the processing unit 16 during the gas exhaust switching operation can also be suppressed.

Figure 11:
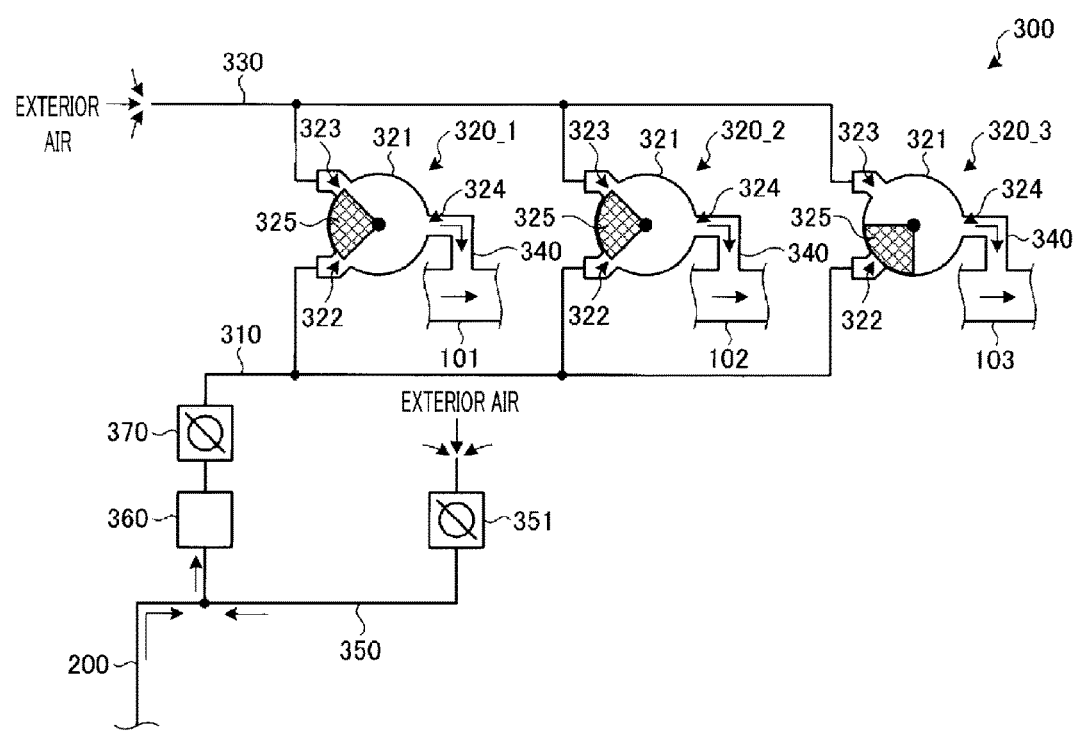
FIG. 11 is a diagram showing a state during a gas exhaust switching operation.

Such a mechanism will be elaborated with reference to FIG. 11. FIG. 11 illustrates a state during the gas exhaust switching operation.

By way of example, when the discharge destination of the gas exhaust is changed from the individual exhaust pipe 101 to the individual exhaust pipe 102, the valve body 325 of the switching mechanism 320_1 is slidably moved from a position where it blocks the exterior air suction opening 323 to a position where it blocks the exhaust gas suction opening 322. In the meantime, the valve body 325 of the switching mechanism 320_2 is slidably moved from a position where it blocks the exhaust gas suction opening 322 to a position where it blocks the exterior air suction opening 323. For some time during which these movements are made, the exhaust gas suction openings 322 and the exterior air suction openings 323 of the switching mechanisms 320_1 and 320_2 are allowed to communicate with the outlet openings 324 temporarily.

Here, if the exterior air suction openings 323 of the respective switching mechanisms 320_1 to 320_3 were directly exposed to the atmosphere, a pressure loss in the inlet path of the exterior air would be reduced as compared to a pressure loss in the inlet path of the exhaust gas where the exhaust gas inlet chamber 310 is provided at the front ends of the exhaust gas suction openings 322. As a result, a flow rate of the exterior air introduced from the exterior air suction openings 323, which suffer less pressure loss, is larger than a flow rate of the exhaust gas introduced from the exhaust gas inlet openings 322.

If the flow rate of the exterior air introduced into the main bodies 321 of the switching mechanisms 320_1 and 320_2 is increased, the flow rate of the exhaust gas introduced into the main bodies 321 from the exhaust gas suction openings 322 is decreased. That is, the flow rate of the exhaust gas during the gas exhaust switching operation is smaller than flow rates of the exhaust gas before and after the gas exhaust switching operation is performed. As a result, an excessive large amount of a gas is supplied into the processing unit 16, so that a leakage of an atmosphere from the processing unit 16 may occur.

Meanwhile, in the substrate processing system 1 according to the present exemplary embodiment, the exterior air inlet chamber 330 is provided at the front ends of the exterior air suction openings 323 of the respective switching mechanisms 320_1 to 320_3. Accordingly, a difference between the pressure loss in the inlet path of the exterior air and the pressure loss in the inlet path of the exhaust gas is reduced, so that it is possible to suppress the flow rate of the exterior air from being increased during the gas exhaust switching operation. That is, since a decrease of the flow rate of the exhaust gas can be suppressed during the gas exhaust switching operation, it is possible to suppress the pressure variation of the processing unit 16 which might be caused by the decrease of the flow rate of the exhaust gas.

Furthermore, the respective exhaust gas suction openings 322 of the switching mechanisms 320_1 to 320_3 communicate with each other via the exhaust gas inlet chamber 310. Likewise, the respective exterior air suction openings 323 of the switching mechanisms 320_1 to 320_3 also communicate with each other via the exterior air inlet chamber 330. Accordingly, during the gas exhaust switching operation, the exhaust gas inlet chamber 310 and the exterior air inlet chamber 330 are allowed to communicate with each other via the switching mechanisms 320_1 to 320_3.

With this configuration, during the gas exhaust switching operation, the pressure variation generated at the side of the inlet path of the exhaust gas can be offset by the pressure variation generated at the side of the inlet path of the exterior air. Thus, the pressure variation of the processing unit 16 during the gas exhaust switching operation can be effectively suppressed.

Now, a switchover of the discharge destination of the exhaust gas from the individual exhaust pipe 102 in which the acidic exhaust gas flows to the individual exhaust pipe 103 in which the organic exhaust gas flows is assumed. In this case, the control unit 18 controls the driving units 326 of the switching mechanisms 320_2 and 320_3 to allow the exhaust gas suction opening 322 of the switching mechanism 320_3 to communicate with the exhaust gas inlet chamber 310 while allowing the exterior air suction openings 323 of the other switching mechanisms 320_1 and 320_2 to communicate with the exterior air inlet chamber 330. Accordingly, while the organic exhaust gas is introduced into the individual exhaust pipe 103, the exterior air is flown into the other individual exhaust pipes 101 and 102.

Here, when changing the kind of the processing liquid used in the processing unit 16 to IPA, which is the organic processing liquid, the control unit 18, changes by controlling the FFU 21, a gas supply amount into the processing unit 16 to a second flow rate smaller than a first flow rate which is set when another kind of processing liquid is used.

Figure 12:
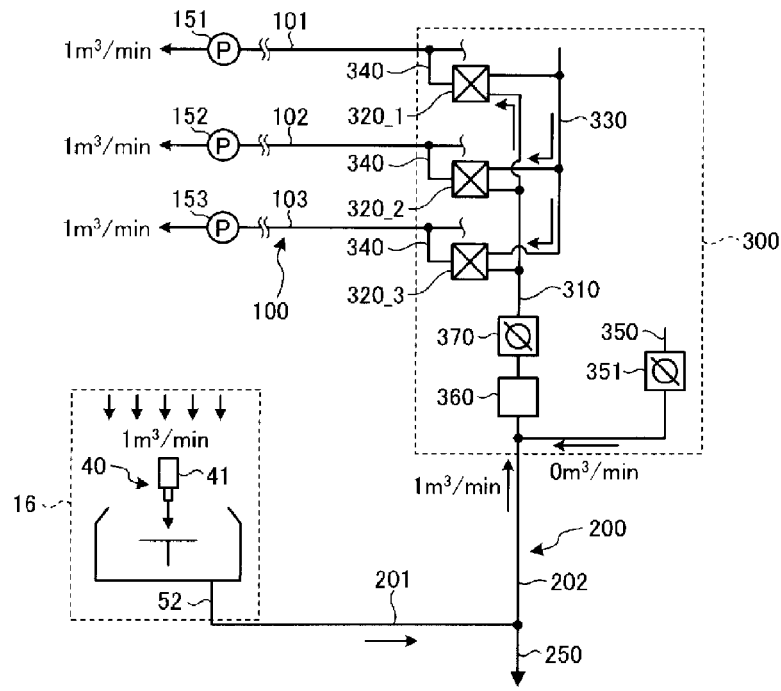
FIG. 12 is a diagram for describing a flow rate adjusting process.
Figure 13:
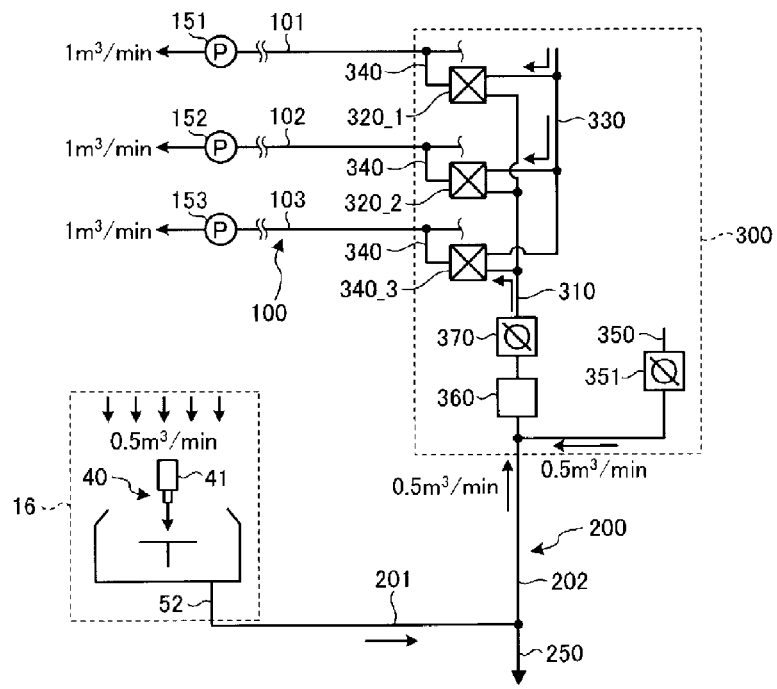
FIG. 13 is a diagram for describing the flow rate adjusting process.

If the gas supply amount into the processing unit 16 is reduced, a required gas exhaust amount is also reduced. In the substrate processing system 1 according to the present exemplary embodiment, when changing the gas supply amount into the processing unit 16 from the first flow rate to the second flow rate, the gas exhaust amount by the exhaust devices 151 to 153 is not changed, but a difference between the gas exhaust amount by the exhaust devices 151 to 153 and the required gas exhaust amount is supplemented by introducing the exterior air from the exterior air suction pipe 350. This process (hereinafter, referred to as "flow rate adjusting process") will be described with reference to FIG. 12 and FIG. 13. FIG. 12 and FIG. 13 are explanatory diagrams for describing the flow rate adjusting process.

FIG. 12 depicts an example where the gas supply amount into the processing unit 16 is the first flow rate, and FIG. 13 depicts an example where the gas supply amount into the processing unit 16 is the second flow rate. Further, in the examples of FIG. 12 and FIG. 13, a gas exhaust amount by each of the exhaust devices 151 to 153 is set to be 1 $m^3$/min. Further, an initial value of a flow rate of the exterior air introduced into the differential pressure port 360 from the exterior air suction pipe 350 is set to be 0 $m^3$/min.

By way of example, when SC1 as the alkaline processing liquid or HF as the acidic processing liquid is used in the processing unit 16, the gas supply amount into the processing unit 16 is set to the first flow rate (e.g., 1 $m^3$/min), as depicted in FIG. 12. In such a case, a required gas exhaust amount is 1 $m^3$/min, and a difference between the required exhaust amount and the exhaust amount by the exhaust devices 151 to 153 is 0 $m^3$/min. Accordingly, the flow rate of the exterior air introduced into the differential pressure port 360 from the exterior air suction pipe 350 is maintained at 0 $m^3$/min. Here, FIG. 12 illustrates an example where the SC1 as the alkaline processing liquid is used in the processing unit 16.

Meanwhile, when IPA as the organic processing liquid is used in the processing unit 16, the gas supply amount into the processing unit 16 is changed from the first flow rate to the second flow rate (e.g., 0.5 $m^3$/min), as depicted in FIG. 13. In such a case, a required gas exhaust amount is 0.5 $m^3$/min, and a difference between the required exhaust amount and the exhaust amount by the exhaust devices 151 to 153 is 0.5 $m^3$/min. Accordingly, the control unit 18 adjusts the flow rate of the exterior air introduced into the differential pressure port 360 from the exterior air suction pipe 350 to 0.5 $m^3$/min by controlling the exterior air flow rate controller 351.

As stated above, in the substrate processing system 1 according to the present exemplary embodiment, when changing the gas supply amount into the processing unit 16 from the first flow rate to the second flow rate smaller than the first flow rate, the flow rate adjusting process of increasing the flow rate of the exterior air flown to the one end of the exterior air suction pipe 350 is conducted by controlling the exterior air flow rate controller 351. Accordingly, it is possible to suppress the pressure variation of the processing unit 16 while maintaining the gas exhaust amount by the exhaust devices 151 to 153 even when the gas supply amount into the processing unit 16 is changed.

Furthermore, although the present exemplary embodiment has been described for the case where the gas supply amount into the processing unit 16 from the FFU 21 is changed from the first flow rate to the second flow rate, the process of changing the gas supply amount from the first flow rate to the second flow rate may not be limited to the aforementioned example. By way of non-limiting example, the process may be applied to a process of changing the kind of a gas supplied into the processing unit 16 from a gas (e.g., clean air) supplied by the FFU 21 to a gas (e.g., dry gas) supplied by an air supply unit (e.g., ceiling nozzle placed in the FFU 21).

Figure 14:
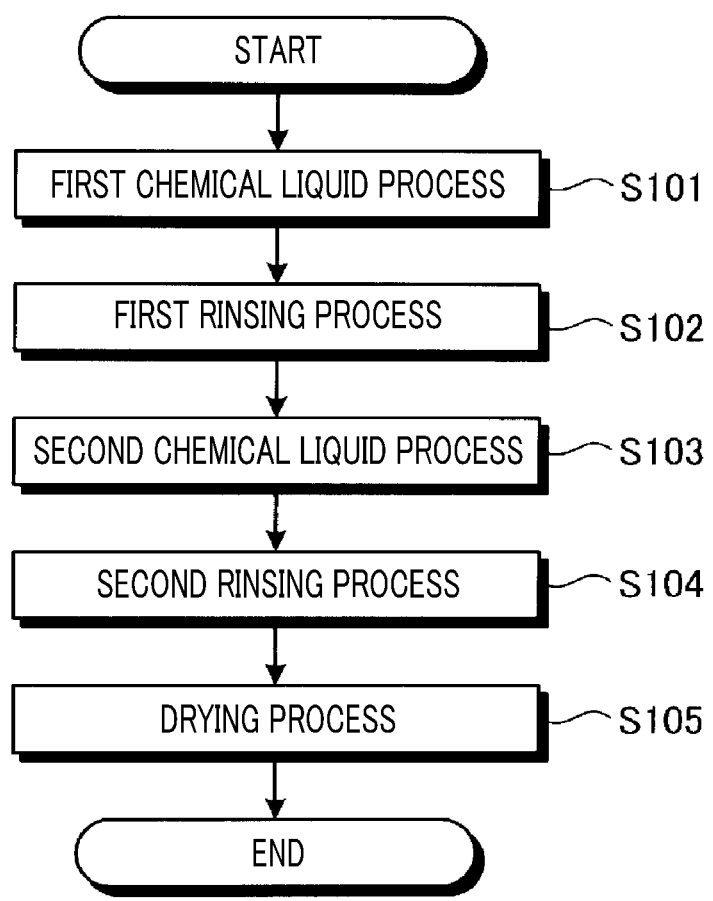
FIG. 14 is a flowchart for describing an example processing sequence of a substrate processing performed in the substrate processing system.

Now, an example of a substrate processing performed in the substrate processing system 1 according to the exemplary embodiment will be described with reference to FIG. 14. FIG. 14 is a flowchart for describing an example processing sequence of the substrate processing performed in the substrate processing system 1.

A series of substrate processings described in FIG. 14 are performed under the control of the control unit 18 over the processing unit 16, the exhaust switching unit 300, and so forth. The control unit 18 is implemented by, but not limited to, a CPU (Central Processing Unit), and controls the processing unit 16, the exhaust switching unit 300, and so forth according to a non-illustrated program stored in the storage unit 19.

As depicted in FIG. 14, a first chemical liquid processing is performed in the processing unit 16 (process S101). In this first chemical liquid process, the driving unit 33 rotates the holding unit 31, so that the wafer W held on the holding unit 31 is rotated at a preset rotation number. Subsequently, the nozzle 41 of the processing fluid supply unit 40 is placed above a central portion of the wafer W. Thereafter, the valve 75 is opened for a preset time, so that SC1 from the alkaline processing liquid supply source 71 is supplied onto a processing target surface of the wafer W from the nozzle 41. The SC1 supplied on the wafer W is diffused onto the entire processing target surface of the wafer W by a centrifugal force generated by the rotation of the wafer W. Accordingly, the processing target surface of the wafer W is processed with the SC1.

While this first chemical liquid process is being performed, a gas is supplied from the FFU 21 into the processing unit 16 at a first flow rate. The supply of the gas at the first flow rate is continued until a second rinsing process of the process S104 is ended. Further, while the first chemical liquid process is being performed, the alkaline exhaust gas from the processing unit 16 is discharged from the second exhaust pipe 200 into the individual exhaust pipe 101 through the switching mechanism 320_1 of the exhaust switching unit 300.

Subsequently, a first rinsing process of cleaning the processing target surface of the wafer W with DIW is performed in the processing unit 16 (process S102). In this first rinsing process, the valve 78 is opened for a preset time, so that the DIW from the DIW supply source 74 is supplied onto the processing target surface of the wafer W from the nozzle 41, and the SC1 remaining on the wafer W is washed away by the DIW. While this first rinsing process is being performed, the exhaust gas from the processing unit 16 is discharged into, for example, the individual exhaust pipe 101.

Then, a second chemical liquid processing is performed in the processing unit 16 (process S103). In this second chemical liquid processing, the valve 76 is opened for a preset time, so that HF from the acidic processing liquid supply source 72 is supplied onto the processing target surface of the wafer W from the nozzle 41. The HF supplied on the wafer W is diffused onto the entire processing target surface of the wafer W by the centrifugal force generated by the rotation of the wafer W. Accordingly, the processing target surface of the wafer W is processed with the HF.

The control unit 18 controls the exhaust switching unit 300 to change the discharge destination of the exhaust gas from the individual exhaust pipe 101 to the individual exhaust pipe 102 before the second chemical liquid process is begun. Accordingly, while the second chemical liquid process is being performed, the acidic exhaust gas from the processing unit 16 is discharged from the second exhaust pipe 200 into the individual exhaust pipe 102 through the switching mechanism 320_2 of the exhaust switching unit 300.

Thereafter, in the processing unit 16, the second rinsing process of cleaning the processing target surface of the wafer W with the DIW is performed (process S104). In this second rinsing process, the valve 78 is opened for a preset time, so that the DIW from the DIW supply source 74 is supplied onto the processing target surface of the wafer W from the nozzle 41, and the HF remaining on the wafer W is washed away. While this second rinsing process is being performed, the exhaust gas from the processing unit 16 is discharged into, for example, the individual exhaust pipe 102.

Then, a drying process is performed in the processing unit 16 (process S105). In this drying process, the valve 77 is opened for a preset time, so that the IPA from the organic processing liquid supply source 73 is supplied onto the processing target surface of the wafer W from the nozzle 41. The IPA supplied on the wafer W is diffused onto the entire processing target surface of the wafer W by the centrifugal force generated by the rotation of the wafer W. Accordingly, the DIW remaining on the processing target surface of the wafer W is substituted with the IPA having higher volatility than that of the DIW. Thereafter, in the processing unit 16, the rotational speed of the wafer W is increased, so that the IPA is dispersed off the wafer W, and the wafer W is dried.

The control unit 18 controls the exhaust switching unit 300 to switch the discharge destination of the exhaust gas from the individual exhaust pipe 102 to the individual exhaust pipe 103 before the drying process is begun. Accordingly, while the drying process is being performed, the organic exhaust gas from the processing unit 16 is discharged into the individual exhaust pipe 103 from the second exhaust pipe 200 through the switching mechanism 320_3 of the exhaust switching unit 300.

Furthermore, the control unit 18 also changes the gas supply amount from the FFU 21 from a first flow rate to a second flow rate smaller than the first flow rate. In addition, the control unit 18 controls the exterior air flow rate controller 351 to increase a flow rate of the exterior air introduced into the differential pressure port 360 from the exterior air suction pipe 350. Accordingly, it is possible to suppress the pressure variation of the processing unit 16 while maintaining the gas exhaust amount by the exhaust devices 151 to 153 even when the gas supply amount into the processing unit 16 is changed.

Afterwards, in the processing unit 16, the rotation of the wafer W by the driving unit 33 is stopped, and the wafer W is carried out from the processing unit 16 by the substrate transfer device 17 (see FIG. 1). Finally, the series of substrate processings on the single sheet of wafer W is completed.

As stated above, the substrate processing system 1 (corresponding to an example of "substrate liquid processing apparatus") according to the present exemplary embodiment includes the processing unit 16 (corresponding to an example of "liquid processing unit"), the first exhaust pipe 100, and the second exhaust pipe 200. The processing unit 16 is configured to process the wafer W with the processing liquid. At least a part of the first exhaust pipe 100 is positioned above the processing unit 16. One end of the second exhaust pipe 200 is connected to the processing unit 16, and the second exhaust pipe 200 evacuates the processing unit 16 through the first exhaust pipe 100 by the exhaust devices 151 to 153. Further, the other end of the second exhaust pipe 200 is connected to a portion of the first exhaust pipe 100 located at the position above the processing unit 16.

According to the substrate processing system 1 of the present exemplary embodiment, the gas-liquid separation of the exhaust gas from the processing unit 16 can be improved.

<Modification Examples>

Figure 15:
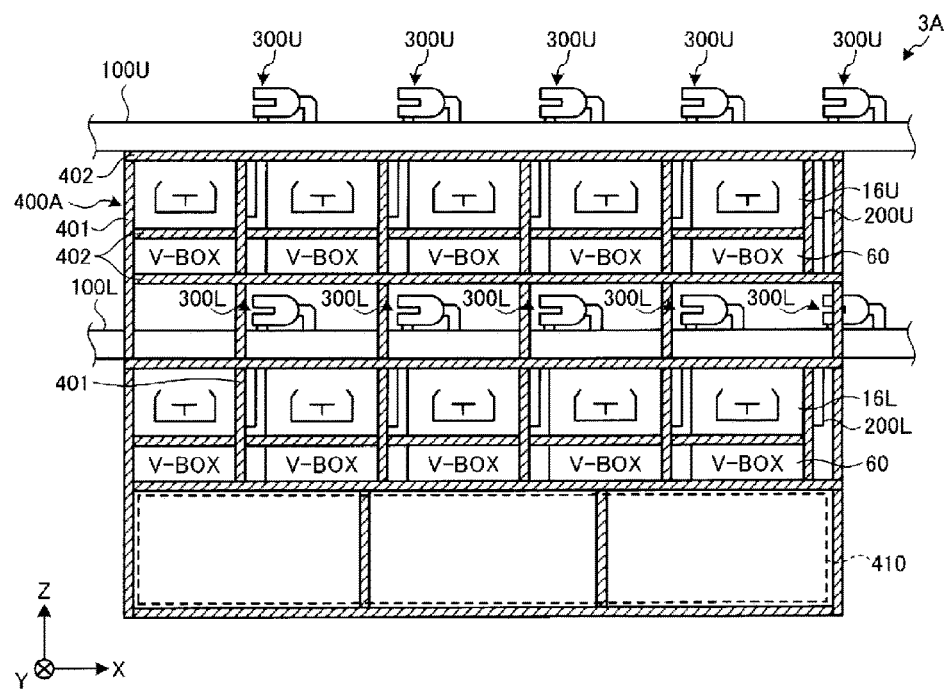
FIG. 15 is a schematic side view illustrating a processing station according to a first modification example.
Figure 16:
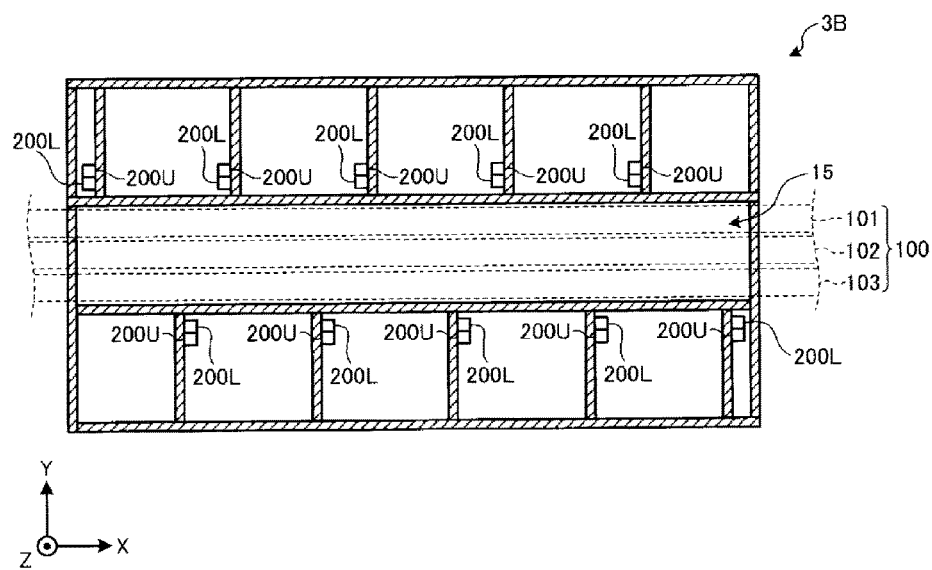
FIG. 16 is a schematic plan view illustrating a processing station according to a second modification example.

Now, modification examples of the substrate processing system 1 according to the present exemplary embodiment will be described with reference to FIG. 15 and FIG. 16. FIG. 15 is a schematic side view of a processing station according to a first modification example, and FIG. 16 is a schematic plan view of the processing station according to the second modification example. Further, in the following description, the same parts as already described above will be assigned same reference numerals, and redundant description thereof will be omitted.

In the above-described exemplary embodiment, the first exhaust pipe 100 is commonly shared by the upper processing units 16U and the lower processing units 16L. However, the substrate processing system may be equipped with an first exhaust pipe 100 for the upper processing units and an first exhaust pipe 100 for the lower processing units separately.

By way of non-limiting example, as depicted in FIG. 15, a processing station 3A according to the first modification example includes a first exhaust pipe 100U corresponding to the upper processing units 16U and a first exhaust pipe 100L corresponding to the lower processing units 16L. The first exhaust pipe 100U is equipped with the exhaust switching units 300U, and the first exhaust pipe 100L is equipped with the exhaust switching units 300L.

The first exhaust pipe 100U is placed on the frame structure 400A, and the first exhaust pipe 100L is placed within the frame structure 400A. To elaborate, the frame structure 400A has an accommodation space for accommodating the first exhaust pipe 100L and the exhaust switching units 300L between a space where upper valve boxes 60 are disposed and a space where the lower processing units 16L are disposed. The first exhaust pipe 100L and the exhaust switching units 300L are placed in this accommodation space.

As stated above, in the processing station 3A according to the first modification example, the first exhaust pipe 100U corresponding to the upper processing units 16U is provided above the processing units 16U, and the first exhaust pipe 100L corresponding to the lower processing units 16L is provided above the processing units 16L and under the processing units 16U. That is to say, the first exhaust pipe is disposed above the processing unit arranged at the corresponding level, and, also, disposed under the processing unit arranged at a level one-level higher than the corresponding level.

By adopting this configuration, the length of second exhaust pipes 200U and the length of second exhaust pipes 200L can be made same at the upper level and the lower level. Accordingly, non-uniformity in the flow resistance of the gas exhaust path may be hardly generated between the processing unit 16U and the processing unit 16L. Accordingly, a difference in the gas exhaust amount may be hardly generated between the upper processing unit 16U and the lower processing unit 16L.

Further, in the above-described exemplary embodiment, the first exhaust pipe 100 corresponding to the processing units 16 arranged at the negative Y-axis side with respect to the transfer section 15 and the first exhaust pipe 100 corresponding to the processing units 16 arranged at the positive Y-axis side with respect to the transfer section 15 are placed above the regions where the corresponding processing units 16 are arranged, respectively (see FIG. 6). However, the location of the first exhaust pipe 100 may not be limited to the above example. By way of example, a first exhaust pipe 100 may be provided above the transfer section 15, as in a processing station 3B according to the second modification example shown in FIG. 16.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
    a liquid processing unit configured to process a substrate with a processing liquid;
    a first exhaust pipe at least a part of which is located above the liquid processing unit and not directly connected to the liquid processing unit; and
    a second exhaust pipe, having one end connected to the liquid processing unit and another end connected to the first exhaust pipe, configured to evacuate the liquid processing unit through the first exhaust pipe by an exhaust device,
    wherein the other end of the second exhaust pipe is connected to a portion of the first exhaust pipe which is located above the liquid processing unit.

2. The substrate liquid processing apparatus of claim 1, further comprising:
    a drain unit provided at a lower portion of the second exhaust pipe, and configured to drain a liquid within the second exhaust pipe to the outside.

3. The substrate liquid processing apparatus of claim 2, wherein the second exhaust pipe comprises an upwardly extending upright portion, and
    the drain unit is provided at a bottommost position of the upright portion.

4. The substrate liquid processing apparatus of claim 1, wherein the liquid processing unit is configured to supply multiple kinds of processing liquids,
    the first exhaust pipe comprises a plurality of individual exhaust pipes that each corresponds to at least one of the multiple kinds of processing liquids, and
    the substrate liquid processing apparatus further comprises an exhaust switching unit configured to change a discharge destination of an exhaust gas flowing within the second exhaust pipe to one of the individual exhaust pipes, wherein the exhaust switching unit is disposed above the liquid processing unit.

5. The substrate liquid processing apparatus of claim 4, wherein the exhaust switching unit is disposed above the individual exhaust pipes.

6. The substrate liquid processing apparatus of claim 1, wherein the liquid processing unit comprises a plurality of liquid processing units stacked in multiple levels, the first exhaust pipe is disposed above a top liquid processing unit located at a topmost level among the plurality of liquid processing units, the second exhaust pipe comprises a plurality of second exhaust pipes corresponding to the plurality of liquid processing units, respectively, and the first exhaust pipe is connected to each of the second exhaust pipes.

7. The substrate liquid processing apparatus of claim 6, wherein each of the plurality of liquid processing units is configured to supply multiple kinds of processing liquids, and the first exhaust pipe comprises a plurality of individual exhaust pipes corresponding to the multiple kinds of processing liquids, respectively, wherein the substrate liquid processing apparatus further comprises a plurality of exhaust switching units provided for the liquid processing units, respectively, each of the plurality of exhaust switching units being configured to change a discharge destination of an exhaust gas flowing within each of the plurality of second exhaust pipes to one of the individual exhaust pipes, and each of the plurality of exhaust switching units comprises an exhaust gas flow rate controller configured to adjust a flow rate of the exhaust gas introduced from each of the plurality of second exhaust pipes.

8. The substrate liquid processing apparatus of claim 7, wherein one of the plurality of exhaust switching units and another of the plurality of exhaust switching units are arranged to face each other.

9. The substrate liquid processing apparatus of claim 1, wherein the liquid processing unit comprises a plurality of liquid processing units that are stacked in multiple levels, the first exhaust pipe comprises a plurality of first exhaust pipes corresponding to the multiple levels of the liquid processing units, respectively, each of the plurality of first exhaust pipes is disposed above a first liquid processing unit disposed above a corresponding level, and each of the plurality of first exhaust pipes is disposed under a second liquid processing unit disposed at a level one-level higher than the corresponding level.

10. The substrate liquid processing apparatus of claim 6, wherein each of the plurality of second exhaust pipes is disposed at the same side of the plurality of liquid processing units.

11. The substrate liquid processing apparatus of claim 1, further comprising:

a transfer section in which the substrate is transferred, wherein the liquid processing unit comprises a plurality of liquid processing units arranged in parallel along the transfer section, and the first exhaust pipe is disposed above a region where the plurality of liquid processing units are arranged in parallel.

12. The substrate liquid processing apparatus of claim 1, further comprising:

a transfer section in which the substrate is transferred; and wherein the liquid processing unit comprises a plurality of liquid processing units arranged in parallel along the transfer section, and the first exhaust pipe is disposed above the transfer section.

13. The substrate processing apparatus of claim 1, further comprising:

a frame structure, having a multiple number of column portions and a multiplicity of beam portions, configured to accommodate the liquid processing unit in accommodation spaces formed by the column portions and the beam portions, wherein the first exhaust pipe is disposed on the frame structure.

* * * * *